US012772853B2

(12) United States Patent
Kang et al.

(10) Patent No.: US 12,772,853 B2
(45) Date of Patent: Oct. 20, 2026

(54) WARPAGE CONTROL

(71) Applicant: SAMSUNG ELECTRONICS CO., LTD., Suwon-si (KR)

(72) Inventors: Sujie Kang, Suwon-si (KR); Minsoo Han, Suwon-si (KR); Minwoo Rhee, Suwon-si (KR); Kyoungwhan Oh, Suwon-si (KR); Kyeongbin Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 365 days.

(21) Appl. No.: 18/632,437

(22) Filed: Apr. 11, 2024

(65) Prior Publication Data

US 2025/0054878 A1 Feb. 13, 2025

(30) Foreign Application Priority Data

Aug. 10, 2023 (KR) ........................ 10-2023-0105094

(51) Int. Cl.

*H10W 42/00* (2026.01)
*H10P 74/20* (2026.01)
*H10W 80/00* (2026.01)

(52) U.S. Cl.

CPC ......... *H10W 42/121* (2026.01); *H10P 74/203* (2026.01); *H10W 80/211* (2026.01); *H10W 80/312* (2026.01); *H10W 80/327* (2026.01)

(58) Field of Classification Search

CPC ............. H10W 42/121; H10W 80/211; H10W 80/312; H10W 80/327; H10P 74/203

See application file for complete search history.

(56) References Cited

U.S. PATENT DOCUMENTS

| | | | |
|---|---|---|---|
| 7,727,785 B2 | 6/2010 | Connell et al. | |
| 10,811,265 B2 | 10/2020 | deVilliers | |
| 10,903,070 B2 | 1/2021 | Liu et al. | |
| 11,094,646 B2 | 8/2021 | Jeng et al. | |
| 2018/0068859 A1 | 3/2018 | deVilliers et al. | |
| 2021/0280606 A1 * | 9/2021 | Oh | H10B 41/35 |
| 2021/0388502 A1 | 12/2021 | Shimabukuro et al. | |
| 2024/0266231 A1 * | 8/2024 | Lee | C23C 14/48 |
| 2025/0305129 A1 * | 10/2025 | Lee | C23C 16/45512 |

FOREIGN PATENT DOCUMENTS

| | | |
|---|---|---|
| KR | 10-2011-0024997 | 3/2011 |
| KR | 10-2185623 | 12/2020 |

* cited by examiner

*Primary Examiner* — Changhyun Yi

(74) *Attorney, Agent, or Firm* — FISH & RICHARDSON P.C.

(57) ABSTRACT

A warpage control method includes measuring displacement in a vertical direction perpendicular to a front surface of a wafer and dividing the front surface of the wafer into a first stress region with a negative displacement value and a second stress region with a positive displacement value, to thereby derive a warpage model, defining a portion of a region, overlapping the first stress region, on the front surface of the wafer as a first compensation region based on the warpage model and defining a region, other than the first compensation region, on the front surface of the wafer as a second compensation region based on the warpage model, to thereby derive a stress compensation film pattern model, and forming a mask pattern in a region on a back surface of the wafer.

20 Claims, 17 Drawing Sheets

WARPAGE CONTROL

CROSS-REFERENCE TO RELATED APPLICATION

This application claims priority under 35 U.S.C. § 119 to Korean Patent Application No. 10-2023-0105094, filed on Aug. 10, 2023, in the Korean Intellectual Property Office, the disclosure of which is incorporated by reference herein in its entirety.

TECHNICAL FIELD

Aspects of this disclosure relate to semiconductor chip manufacturing methods incorporating warpage control.

BACKGROUND

To improve the performance and storage capacities of semiconductor devices, chip-to-chip structures in which a plurality of semiconductor wafers are bonded to each other have been widely used. However, as the degree of integration of elements inside a wafer increases, wafer warpage occurs due to the stress of insulating layers stacked inside the wafer. This wafer warpage causes defects in subsequent processes in which a plurality of semiconductor wafers are bonded to each other.

SUMMARY

Aspects of this disclosure provide a semiconductor chip manufacturing method by which the occurrence of detects during a process of bonding a plurality of wafers is reduced or prevented by controlling warpage of the wafers.

In some implementations, there is provided a warpage control method including measuring displacement in a vertical direction perpendicular to a front surface of a wafer and dividing the front surface of the wafer into a first stress region with a negative displacement value and a second stress region with a positive displacement value, to thereby derive a warpage model, defining a portion of a region, overlapping the first stress region, on the front surface of the wafer as a first compensation region based on the warpage model and defining a region, other than the first compensation region, on the front surface of the wafer as a second compensation region based on the warpage model, to thereby derive a stress compensation film pattern model, forming a mask pattern in a region on a back surface of the wafer, which overlaps the second compensation region on the front surface of the wafer in the vertical direction, and depositing a stress compensation film on the entire back surface of the wafer.

In some implementations, there is provided a semiconductor chip manufacturing method including controlling warpage of a first wafer and forming a chip-to-chip structure by bonding a first conductive pad on a front surface of the first wafer and a second conductive pad on a front surface of a second wafer to each other, wherein the controlling of the warpage of the first wafer includes measuring displacement in a vertical direction perpendicular to the front surface of the first wafer and dividing the front surface of the first wafer into a first stress region with a negative displacement value and a second stress region with a positive displacement value, to thereby derive a warpage model, defining a portion of a region, overlapping the first stress region, on the front surface of the first wafer as a first compensation region based on the warpage model and defining a region, other than the first compensation region, on the front surface of the first wafer as a second compensation region based on the warpage model, to thereby derive a stress compensation film pattern model, applying a capping insulating layer on the front surface of the first wafer to cover the first conductive pad, forming a mask pattern in a region on a back surface of the first wafer, which overlaps the second compensation region on the front surface of the first wafer in the vertical direction, and depositing a stress compensation film on the entire back surface of the first wafer.

In some implementations, there is provided a semiconductor chip manufacturing method including bonding a first chip and a second chip to each other, wherein the first chip includes a first wafer, a cell region provided on a front surface of the first wafer and including a plurality of word lines stacked in a vertical direction, and a first conductive pad on the cell region, and the second chip includes a second wafer and a peripheral region provided on a front surface of the second wafer and including a plurality of circuit elements, the semiconductor chip manufacturing method including measuring displacement in a direction perpendicular to the front surface of the first wafer and dividing the front surface of the first wafer into a first stress region with a negative displacement value and a second stress region with a positive displacement value, to thereby derive a warpage model, defining a portion of a region, overlapping the first stress region, on the front surface of the first wafer as a first compensation region based on the warpage model and defining a region, other than the first compensation region, on the front surface of the first wafer as a second compensation region based on the warpage model, to thereby derive a stress compensation film pattern model, applying a capping insulating layer on the front surface of the first wafer, forming a mask pattern in a region on a back surface of the first wafer, which overlaps the second compensation region on the front surface of the first wafer, depositing the stress compensation film on the entire back surface of the first wafer, removing the capping insulating layer on the front surface of the first wafer and bonding the first conductive pad on the front surface of the first wafer and a second conductive pad on the front surface of the second wafer to each other using copper to copper bonding, and removing the stress compensation film and the mask pattern on the back surface of the first wafer, wherein the first compensation region does not overlap the second stress region on the front surface of the first wafer.

BRIEF DESCRIPTION OF THE DRAWINGS

Implementations will be understood from the following detailed description taken in conjunction with the accompanying drawings.

FIGS. 2 and 4 are plan views of a wafer and FIGS. 3, 5, and 6 are cross-sectional views taken along line A-A' of FIG. 2. FIG. 7 is a plan view of a wafer shown in FIG. 6, and FIG. 9 is a plan view of a wafer shown in FIG. 8.

FIG. 14 is a plan view corresponding to FIG. 4 and FIGS. 15 and 16 are cross-sectional views corresponding to FIGS. 6 and 8, respectively.

DETAILED DESCRIPTION

Hereinafter, examples are described in detail with reference to the accompanying drawings. Implementations may, however, be embodied in different forms and should not be construed as limited to the examples set forth herein. Rather, these examples are provided so that this disclosure will be thorough and complete, and will fully convey the scope of the disclosure to those skilled in the art.

Figure 1:
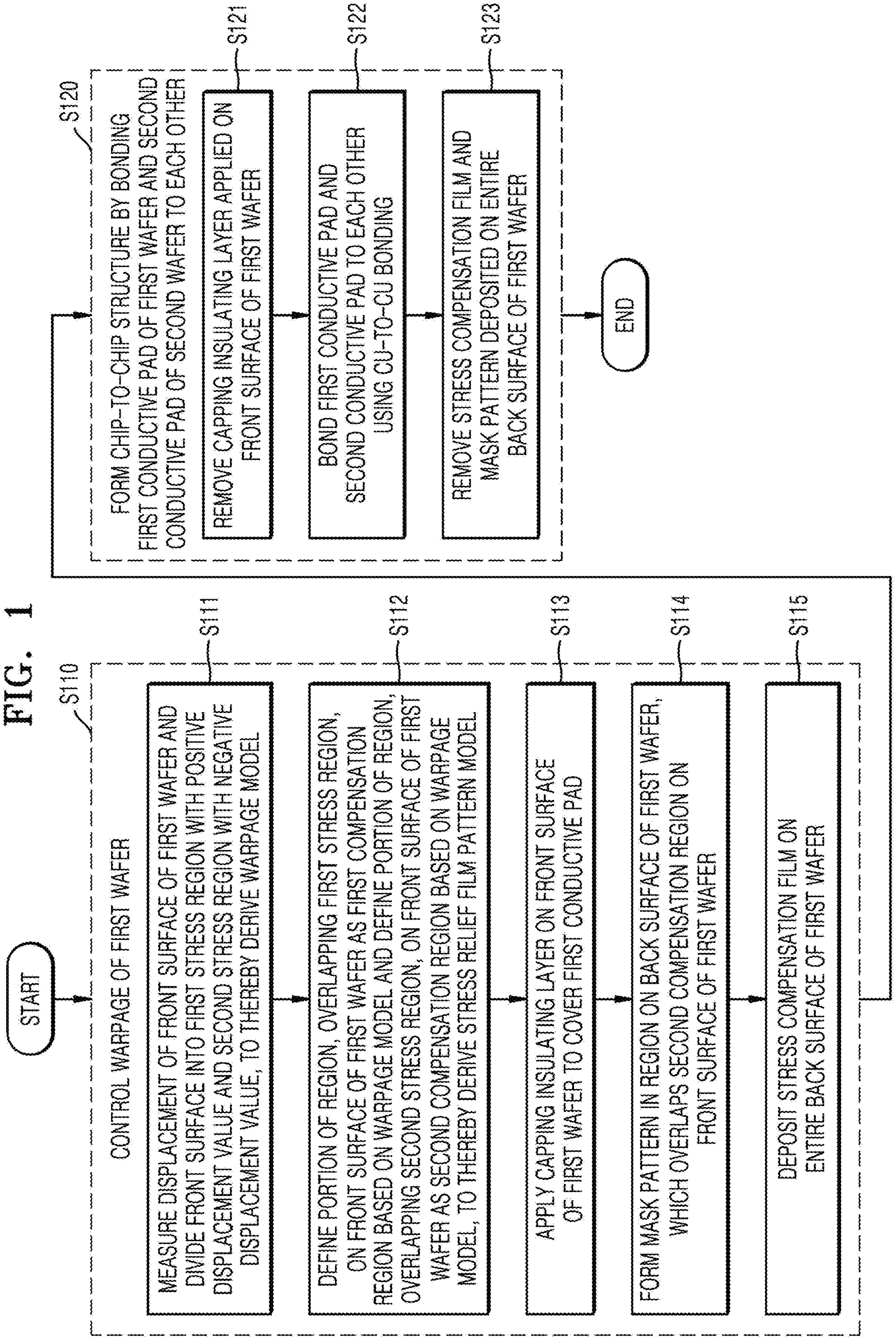
FIG. 1 is a flowchart of a semiconductor chip manufacturing method according to some implementations.
Figure 2:
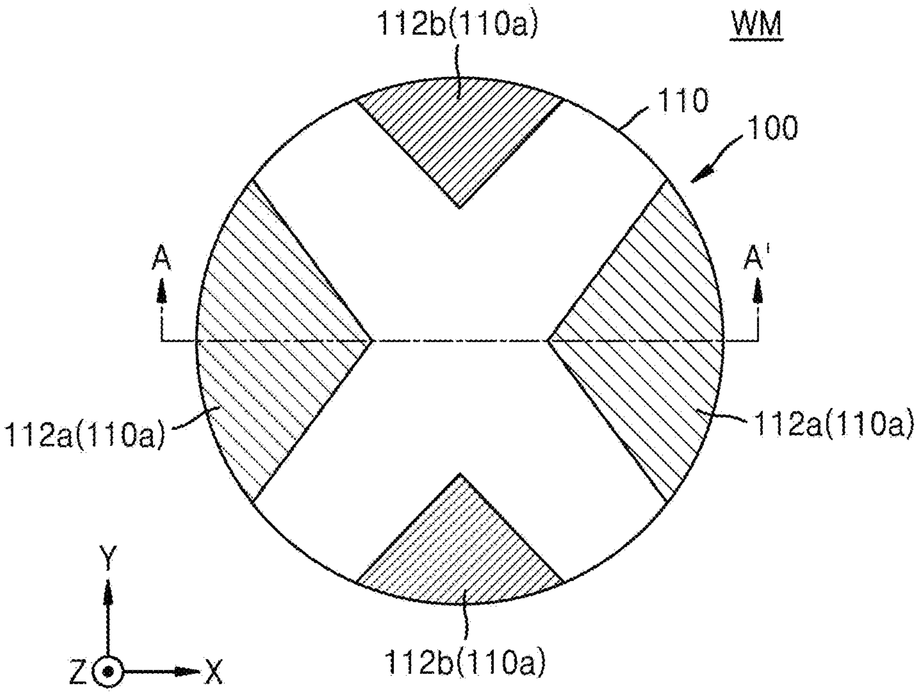
FIGS. 2-11 are diagrams sequentially showing a semiconductor chip manufacturing method.
Figure 3:
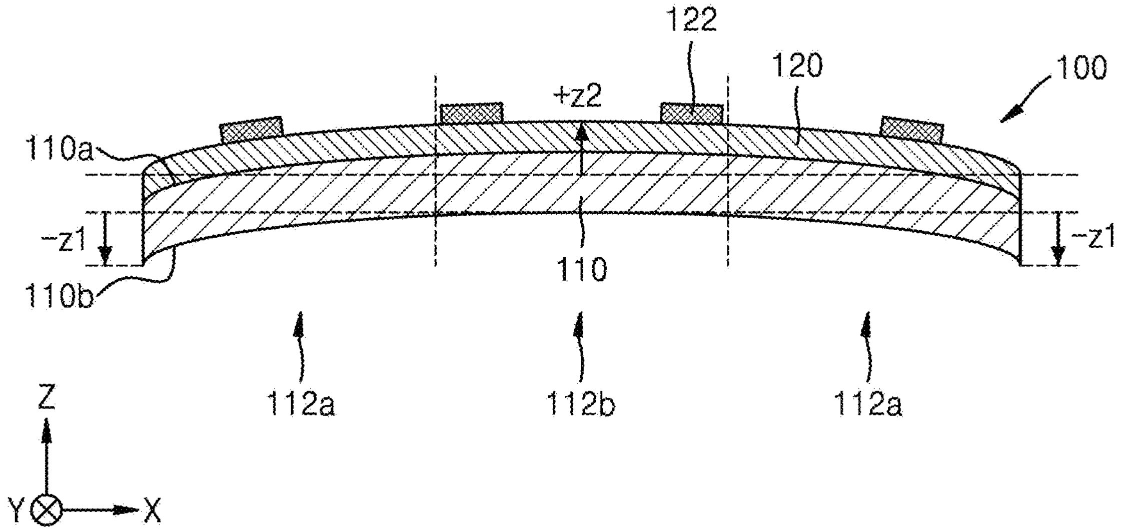
Figure 4:
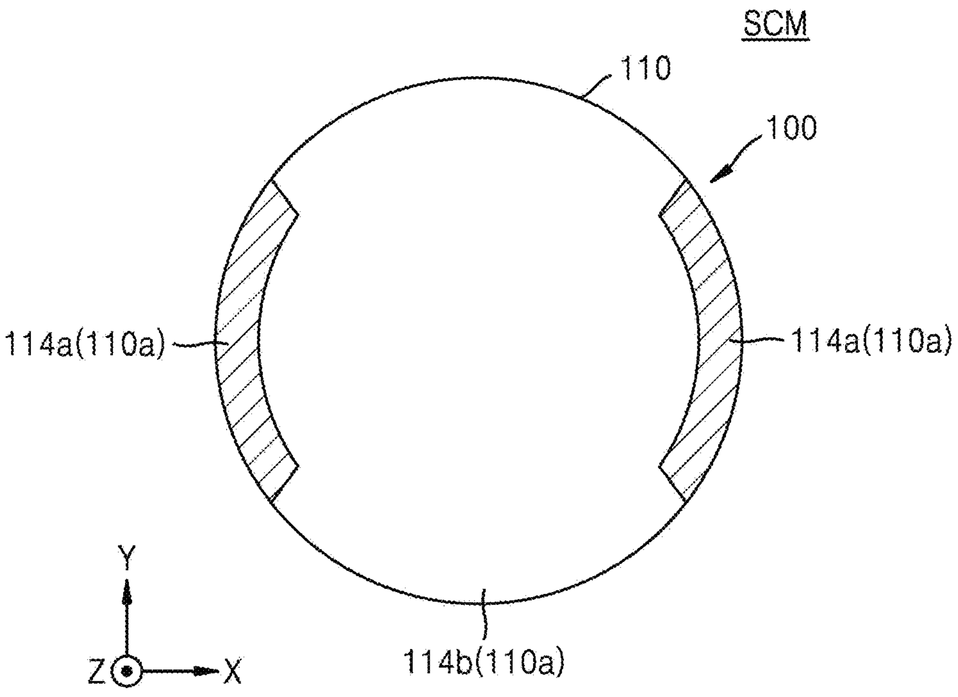
Figure 5:
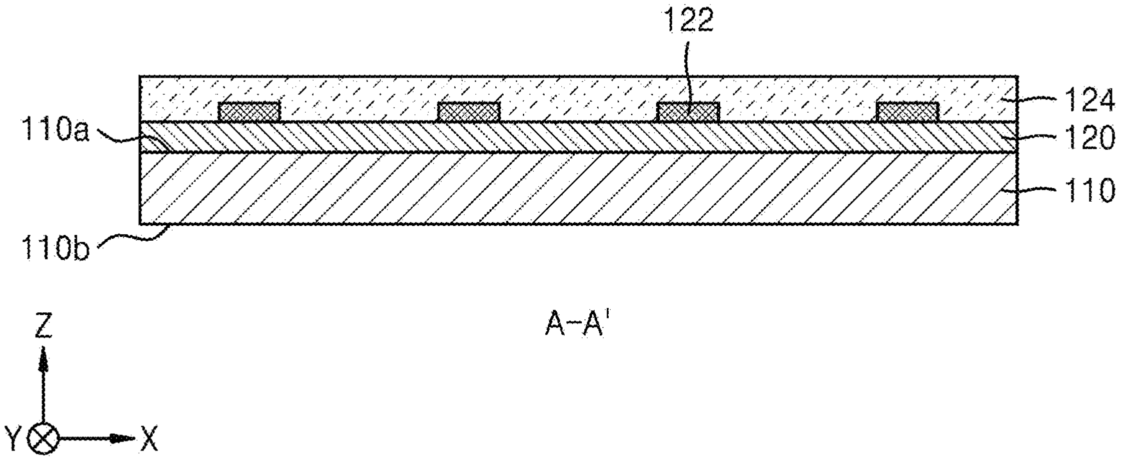
Figure 6:
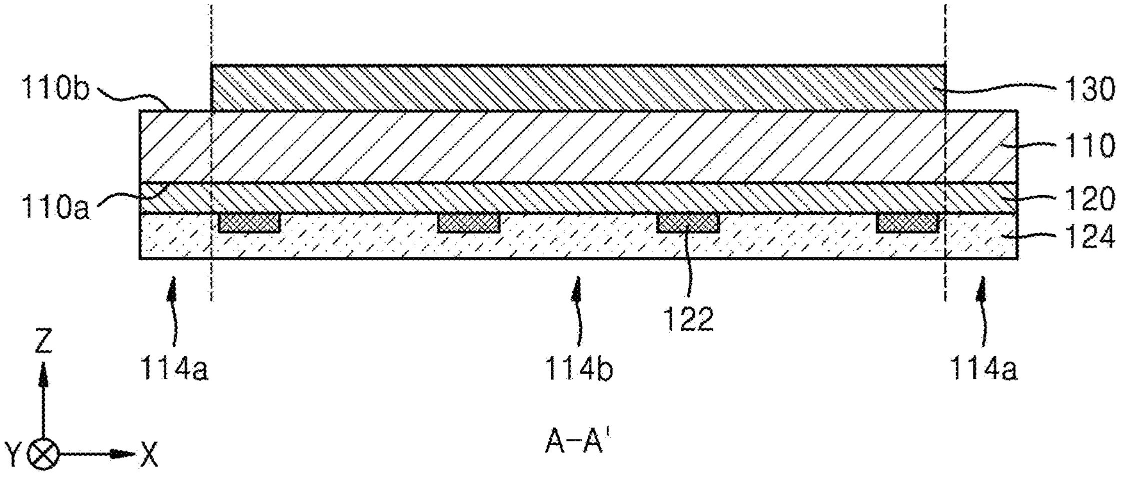
Figure 7:
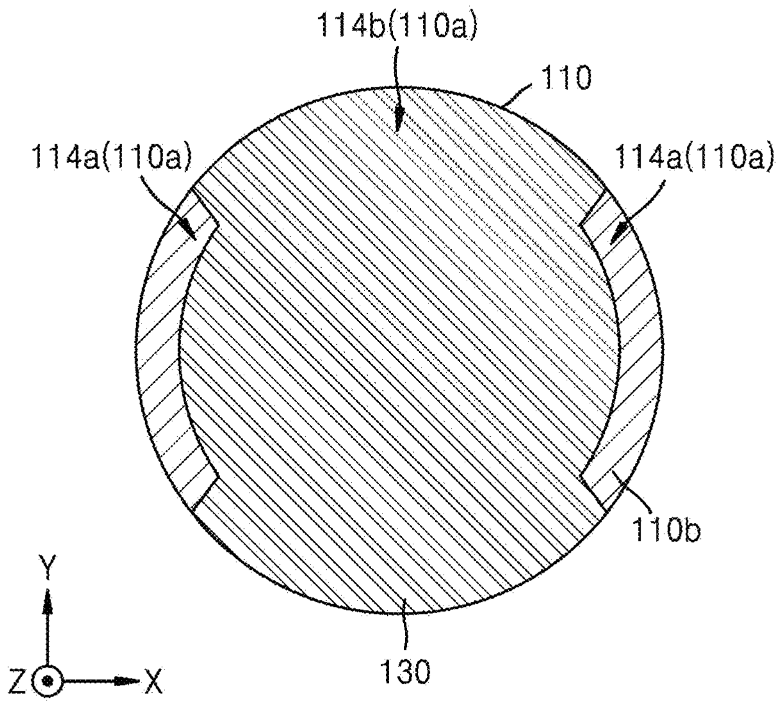

FIG. 1 is a flowchart of a semiconductor chip manufacturing method according to some implementations. FIGS. 2 to 11 are diagrams sequentially showing a semiconductor chip manufacturing method (e.g., the method of FIG. 1). In particular, FIGS. 2 and 4 are plan views of a wafer and FIGS. 3, 5, and 6 are cross-sectional views taken along line A-A' of FIG. 2. FIG. 7 is a plan view of a wafer shown in FIG. 6, and FIG. 9 is a plan view of a wafer shown in FIG. 8. FIG. 11 is also referred to for convenience of description.

Referring to FIGS. 2 and 3 together with FIG. 1, the semiconductor chip manufacturing method according to some implementations may include an operation (S110) of controlling warpage of a first wafer 110 and an operation (S120) of forming a chip-to-chip structure by bonding a first conductive pad 122 of the first wafer 110 and a second conductive pad 162 (see FIG. 11) of a second wafer 150 (see FIG. 11) to each other.

The operation (S110) of controlling the warpage of the first wafer 110 may include an operation (S111) of measuring displacement in a vertical direction (Z direction) relative to a first front surface 110*a* of the first wafer 110 and dividing the first front surface 110*a* of the first wafer 110 into a first stress region 112*a* with a negative displacement value −z1 and a second stress region 112*b* with a positive displacement value +z2, to thereby derive a warpage model WM.

The warpage model WM of the first wafer 110 shown in FIGS. 2 and 3 is only an example for description, and the warpage model WM is not limited to that shown in FIGS. 2 and 3. That is, the shapes and arrangements of the first stress region 112*a* and the second stress region 112*b* are not limited to those shown in FIGS. 2 and 3. FIG. 2 is the warpage model WM of a first chip 100 shown in FIG. 3. The first chip 100 may include a first wafer 110 that provides a first front surface 110*a*, which is a space on which a first insulating layer 120 is laminated, and a first back surface 110*b* opposite to the first front surface 110*a*. Also, the first chip 100 may include the first insulating layer 120 laminated on the first front surface 110*a* of the first wafer 110 and a plurality of first conductive pads 122 formed on the first insulating layer 120.

In this specification, a direction perpendicular to the first front surface 110*a* of the first wafer 110 (neglecting warpage) may be defined as a vertical direction (Z direction) and a direction parallel to the first front surface 110*a* of the first wafer 110 may be defined as a first horizontal direction (X direction). Also, a direction parallel to the first front surface 110*a* of the first wafer 110 and perpendicular to the first horizontal direction (X direction) may be defined as a second horizontal direction (Y direction).

According to some implementations, the first front surface 110*a* of the first wafer 110 may have a shape convex in the vertical direction (Z direction). Regions spaced apart from one another in the second horizontal direction (Y direction) and arranged on the outside of the first front surface 110*a* of the first wafer 110 may have a positive second displacement value +z2 in the vertical direction (Z direction) and regions spaced apart from one another in the first horizontal direction (X direction) and arranged on the outside of the first front surface 110*a* of the first wafer 110 may have a negative first displacement value −z1 in the vertical direction (Z direction). The warpage model WM may be derived based on the measured displacement value of the first front surface 110*a* of the first wafer 110 in the vertical direction (Z direction). In the warpage model WM, the first front surface 110*a* of the first wafer 110 may include the first stress region 112*a* and the second stress region 112*b*. The first stress region 112*a* may include a portion of the first front surface 110*a* of the first wafer 110 that has the negative first displacement value −z1 due to stress and the second stress region 112*b* may include a portion of the first front surface 110*a* of the first wafer 110 that has the positive second displacement value +z2 due to stress.

Referring to FIG. 4 together with FIG. 1, the semiconductor chip manufacturing method may include an operation (S112) of defining a portion of a region, corresponding to the first stress region 112*a*, on the first front surface 110*a* of the first wafer 110 as a first compensation region 114*a* based on the warpage model WM and defining a region, other than the first compensation region 114*a*, on the first front surface 110*a* of the first wafer 110 as a second compensation region 114*b* based on the warpage model, to thereby derive a stress compensation film pattern SCM. For example, the second compensation region 114*b* can be an entirety of the first front surface 110 other than the first compensation region 114*a*. In this specification, the fact that the first compensation region 114*a* corresponds to the first stress region 112*a* may mean that the first compensation region 114*a* overlaps the first stress region 112*a*.

The first compensation region 114*a* may include a region that overlaps at least a portion of the first stress region 112*a*. The first compensation region 114*a* may be completely identical to the first stress region 112*a*. However, in some implementations, the first compensation region 114*a* may overlap only a portion of the first stress region 112*a*. In some implementations, the first compensation region 114*a* is completely included in the first stress region 112*a*.

The first stress region 112*a* may include a portion of the first front surface 110*a* of the first wafer 110 having a negative first displacement value −z1 in the vertical direction (Z direction) and may be defined as a region in which the first front surface 110*a* of the first wafer 110 is compensated to have a positive displacement value. Similarly, the second stress region 112*b* may include a portion of the first front surface 110*a* of the first wafer 110 having a positive second displacement value +z2 in the vertical direction (Z direction) and may be defined as a region in which the first front surface 110*a* of the first wafer 110 is compensated to have a negative displacement value.

In some implementations, the first stress region 112*a* and the second stress region 112*b* shown in FIG. 2 are defined by dividing the first front surface 110*a* of the first wafer 110 into continuous sections through finite element analysis (FEA). When FEA is used, the displacement values of the first front surface 110*a* of the first wafer 110 in the vertical direction (Z direction) may be more precisely determined and the corresponding warpage compensation values may also be more precisely determined.

Referring to FIG. 5 together with FIG. 1, the semiconductor chip manufacturing method according to some implementations may include an operation (S113) of applying a capping insulating layer 124 that covers the first conductive pad 122 disposed on the first front surface 110*a* of the first wafer 110.

In FIG. 5, for convenience of illustration, the first wafer 110 is shown not as having a warped shape but as having a flat shape. Although the first wafer 110 is shown as having a flat shape in FIG. 5, the first wafer 110 may actually have a warped shape as shown in FIG. 3. The capping insulating layer 124 may protect the first conductive pad 122 from being damaged during subsequent processes of forming a mask pattern 130 (see FIG. 6) and a stress compensation film 140 (see FIG. 8). The capping insulating layer 124 may include silicon nitride. The capping insulating layer 124 may be formed along the upper surface of the first insulating layer 120 and completely cover the side and upper surfaces of the first conductive pad 122. The upper surface of the capping insulating layer 124 may have the same area as the upper surface of the first insulating layer 120. However, in some implementations, the upper surface of the capping insulating layer 124 may have only a minimum area necessary to cover the first conductive pad 122. In this case, the capping insulating layer 124 may cover all of the plurality of first conductive pads 122, but the upper surface of the capping insulating layer 124 may be (though need not be) smaller than that of the first insulating layer 120.

Referring to FIGS. 6 and 7 together with FIG. 1, the semiconductor chip manufacturing method according to some implementations may include an operation (S114) of forming a mask pattern 130 in a region on the first back surface 110*b* of the first wafer 110, which overlaps the second compensation region 114*b* on the first front surface 110*a* of the first wafer 110.

The mask pattern 130 may be formed along a portion of the first back surface 110*b* of the first wafer 110. The mask pattern 130 may be deposited on the first back surface 110*b* of the first wafer 110 using an inkjet printing technique. When the mask pattern 130 is formed using the inkjet printing technique, it is possible to form a large-area mask pattern 130 having a more complex shape. The mask pattern 130 having a complex shape may be manufactured more simply using the inkjet printing technique, and thus, warpage due to local stress that occurs in the first wafer 110 may be more effectively controlled and prevented.

The mask pattern 130 may be formed on the first back surface 110*b* of the first wafer 110 so as to overlap (e.g., completely overlap) the second compensation region 114*b* of the first front surface 110*a* of the first wafer 110. For example, the area of the upper surface of the mask pattern 130 may be equal to the area of the second compensation region 114*b*. In some implementations, the mask pattern 130 may also overlap a portion of the first compensation region 114*a*. The mask pattern 130 may be formed on a region of the first wafer 110 other than a region that is in contact with a stress compensation film 140 (see FIG. 8) formed subsequently. The mask pattern 130 may include a soft mask, such as photoresist, or a hard mask, such as a silicon nitride film and/or a silicon nitride film. For example, the mask pattern 130 may include photosensitive polyimide.

Figure 8:
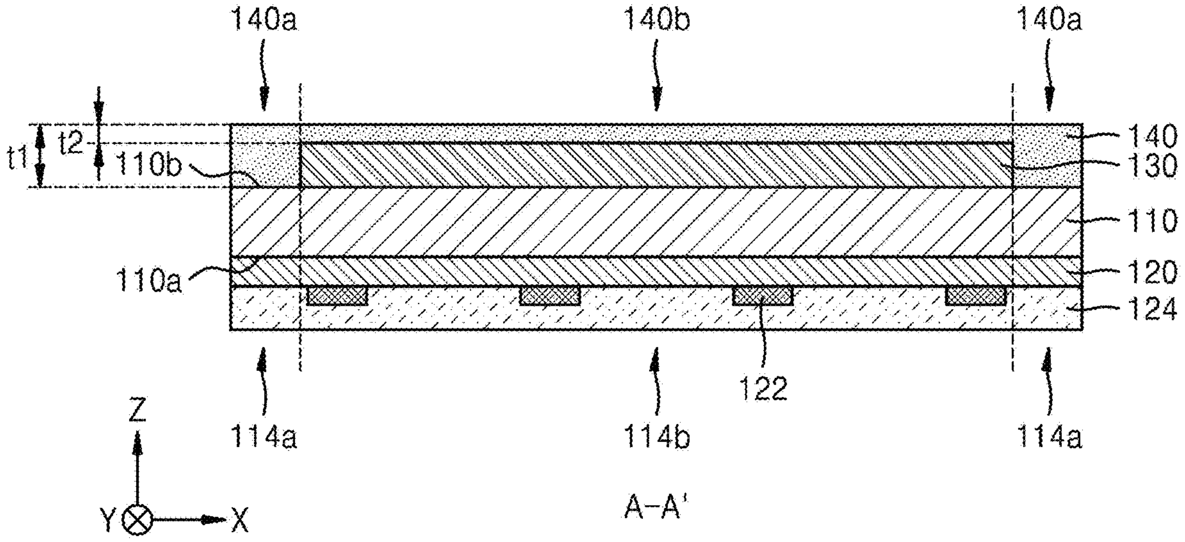
Figure 9:
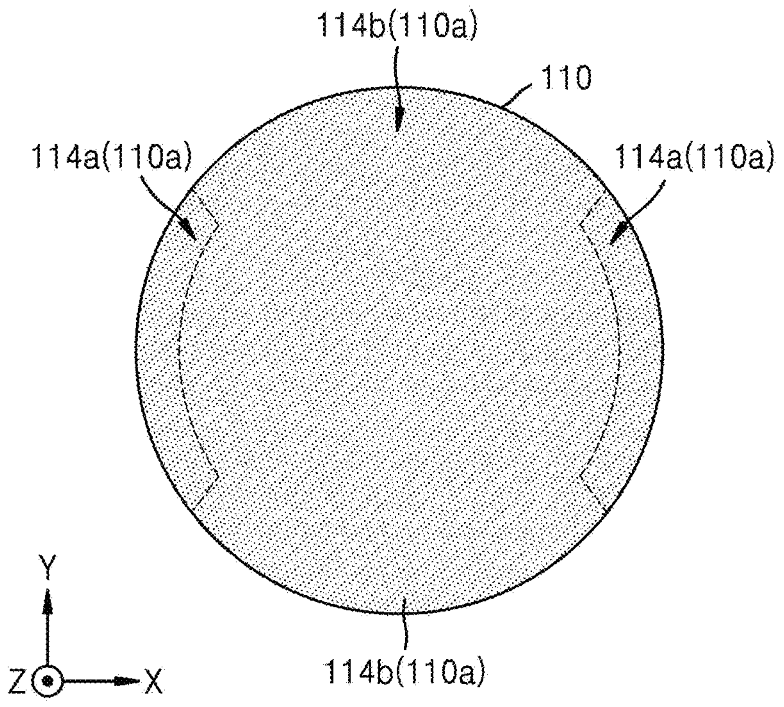

Referring to FIGS. 8 and 9 together with FIG. 1, the semiconductor chip manufacturing method according to some implementations may include an operation (S115) of depositing a stress compensation film 140 over an entirety of the first back surface 110*b* of the first wafer 110.

The stress compensation film 140 deposited on the first back surface 110*b* of the first wafer 110 may cover the upper surface and side surfaces of the mask pattern 130. The stress compensation film 140 may cover the mask pattern 130 and a portion of the first back surface 110*b* of the first wafer 110. Here, a region of the first back surface 110*b* of the first wafer 110, which is covered by the stress compensation film 140, may overlap the first compensation region 114*a*.

The stress compensation film 140 may include a first stress compensation film region 140*a* overlapping the first compensation region 114*a* of the first front surface 110*a* of the first wafer 110 in the vertical direction (Z direction) and a second stress compensation film region 140*b* overlapping the second compensation region 114*b* of the first front surface 110*a* of the first wafer 110 in the vertical direction (Z direction). Here, a thickness t1 of the first stress compensation film region 140*a* may be greater than a thickness t2 of the second stress compensation film region 140*b*. The first stress compensation film region 140*a* may be in contact with and cover the first back surface 110*b* of the first wafer 110 and the second stress compensation film region 140*b* may be in contact with and cover the upper surface of the mask pattern 130. Therefore, a portion of the stress compensation film 140 that overlaps the first compensation region 114*a* in the vertical direction (Z direction) has specific gravity that is different from that of a portion of the stress compensation film 140 that overlaps the second compensation region 114*b* in the vertical direction (Z direction). This difference in thickness or specific gravity may ultimately result in a difference in stress applied to the first wafer 110.

In FIG. 8, the stress compensation film 140 is shown as a single layer. However, in some implementations, the stress compensation film 140 may include a plurality of layers. The stress compensation film 140 may have compressive stress or tensile stress. The stress compensation film 140 deposited on the first back surface 110*b* of the first wafer 110 applies external force to the first wafer 110, and thus, the first wafer 110 may receive stress from the stress compensation film 140. The stress compensation film 140 may include a silicon nitride film, a silicon oxide film, or a combination thereof. For example, the silicon oxide film may be formed using tetraethyl orthosilicate. However, the material of the stress compensation film 140 is not limited to those described above.

When the stress compensation film 140 is deposited on the first back surface 110*b* of the first wafer 110, the first wafer 110 may be bent to form curvature toward the first back surface 110*b* of the first wafer 110. Specifically, in a portion of the first wafer 110 covered by the stress compensation film 140, the displacement value in the vertical direction (Z direction) may decrease so as to be opposite to the positive displacement value shown in FIG. 3. That is, the portion of the first wafer 110 covered by the stress compensation film 140 may have a negative displacement value in the vertical direction (Z direction). In other words, the first wafer 110 may be bent in a direction opposite to the bending direction shown in FIG. 3.

In some implementations, the second stress compensation film region 140*b* on the upper surface of the mask pattern 130 may be completely removed through a planarization process, such as a chemical mechanical polishing process. The stress compensation film 140 may be deposited by at least one of a chemical vapor deposition process, a physical vapor deposition process, or an atomic layer deposition process.

The stress compensation film 140 is deposited on the first back surface 110*b* of the first wafer 110 having warpage, and thus, the displacement value in the vertical direction (Z direction) of the first wafer 110 due to the warpage may be compensated.

In addition, according to some implementations, the upper surface of the mask pattern 130 may be plasma-treated, and the stress compensation film 140 may be deposited using a selective atomic layer deposition process. Here, since the upper surface of the mask pattern 130 is plasma-treated with a specific element, such as oxygen or hydrogen, the stress compensation film 140 may not grow well on the upper surface of the mask pattern 130. In this case, the thickness of the first stress compensation film region 140*a* in contact with the first back surface 110*b* of the first wafer 110 may be different from the thickness of the second stress compensation film region 140*b* in contact with the upper surface of the mask pattern 130.

Figure 10:
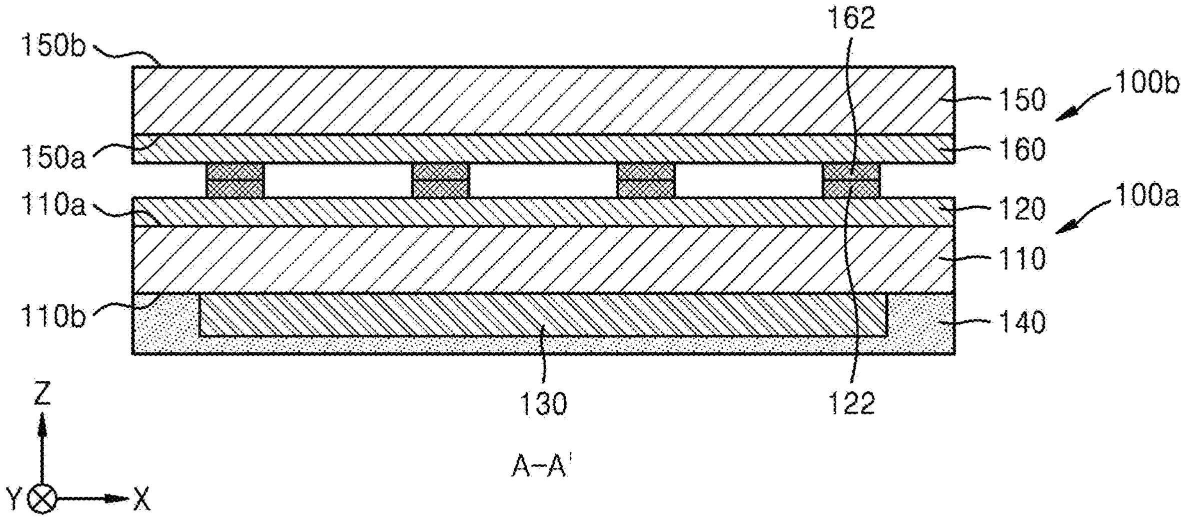
Figure 11:
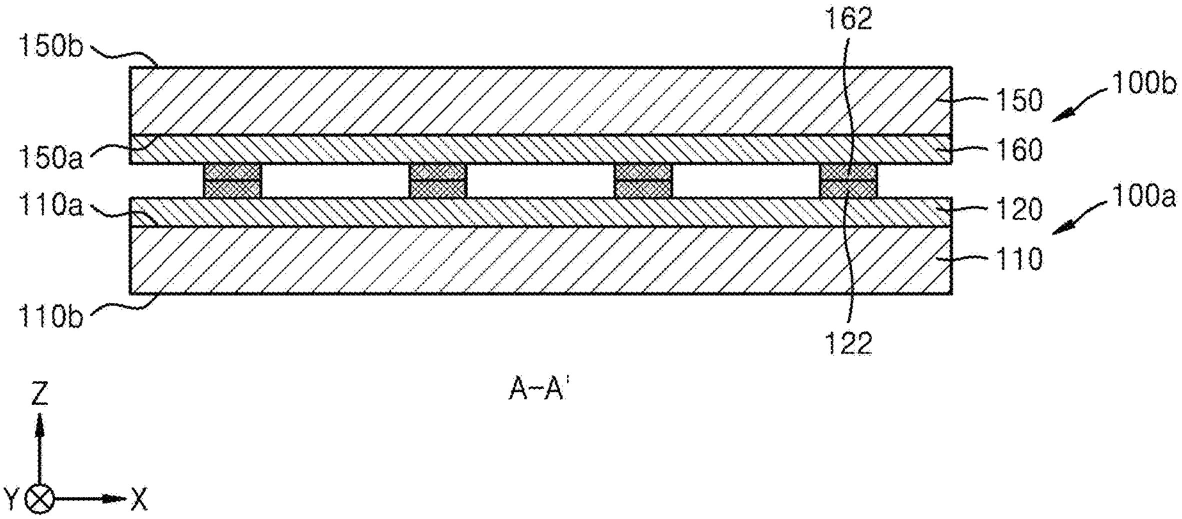

Referring to FIG. 10 together with FIG. 1, the semiconductor chip manufacturing method according to some implementations may include an operation (S120) of forming a chip-to-chip structure by bonding the first conductive pad 122 of the first wafer 110 and the second conductive pad 162 of the second wafer 150 to each other. Here, the operation (S120) of forming the chip-to-chip structure may include an operation (S121) of removing the capping insulating layer 124 applied on the first front surface 110*a* of the first wafer 110 and an operation (S122) of bonding the first conductive pad 122 on the first front surface 110*a* of the first wafer 110 and the second conductive pad 162 on a second front surface 150*a* of the second wafer 150 to each other using copper to copper (Cu-to-Cu) bonding.

According to some implementations, a second chip 100*b* may include the second wafer 150, a second insulating layer 160 laminated on the second front surface 150*a* of the second wafer 150, and the second conductive pad 162 disposed on the second insulating layer 160. As the mask pattern 130 and the stress compensation film 140 are deposited on the first back surface 110*b* of the first wafer 110, the first front surface 110*a* of the first wafer 110 may be flat with no warpage. Accordingly, the second conductive pad 162 on the second wafer 150 and the first conductive pad 122 on the first wafer 110 may be bonded without misalignment.

Referring to FIG. 11 together with FIG. 1, the semiconductor chip manufacturing method according to some implementations may include an operation (S123) of removing the stress compensation film 140 and the mask pattern 130, which are provided on the first back surface 110*b* of the first wafer 110.

Figure 12:
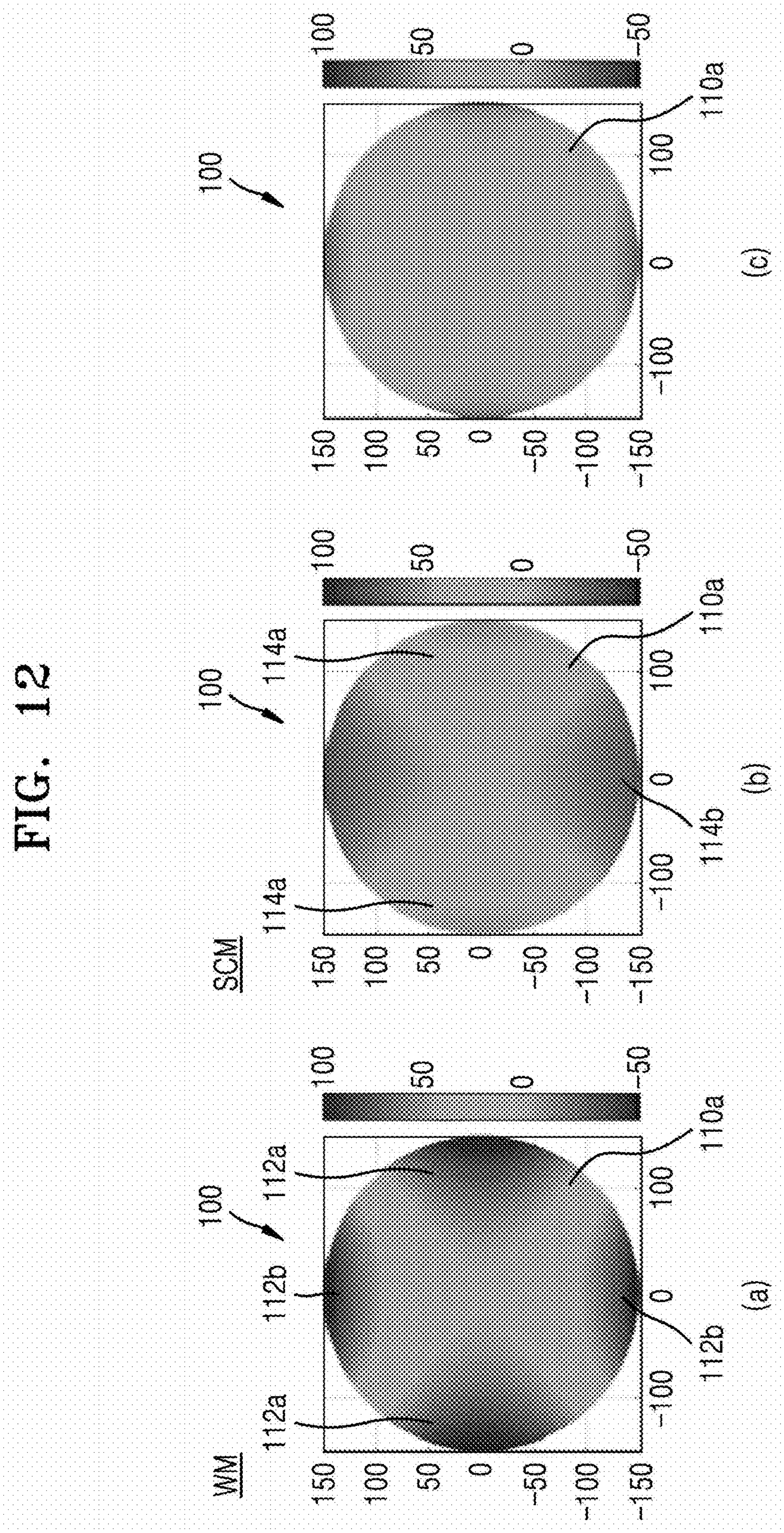
FIG. 12 illustrates images respectively showing a derived warpage model, a stress compensation film pattern model, and warpage result values after warpage control.

FIG. 12 illustrates images respectively showing a derived warpage model, a stress compensation film pattern model, and warpage result values after warpage control.

Referring to FIG. 12, image (a) may correspond to the warpage model WM shown in FIG. 2. Image (a) shown in FIG. 12 corresponds to the warpage model WM, which is derived by measuring the displacement of the first front surface 110*a* of the first wafer 110 and dividing the first front surface 110*a* into the first stress region 112*a* with a negative displacement value and the second stress region 112*b* with a positive displacement value. Image (b) corresponds to the stress compensation film pattern SCM, which is derived by defining a portion of a region, corresponding to the first stress region 112*a*, on the first front surface 110*a* of the first wafer 110 as the first compensation region 114*a* based on the warpage model WM and defining a region, other than the first compensation region 114*a*, on the first front surface 110*a* of the first wafer 110 as a second compensation region 114*b* based on the warpage model WM. Image (c) corresponds to a warpage model of the first wafer 110, which is derived after depositing the stress compensation film 140 and the mask pattern 130 (see FIG. 6) on the first wafer 110 according to the stress compensation film pattern SCM. As shown in image (c), when the stress compensation film 140 and the mask pattern 130 (see FIG. 6) are deposited according to the stress compensation film pattern SCM after the stress compensation film pattern SCM is derived based on the warpage model WM, it can be seen that the warpage of the first wafer 110 is effectively improved.

Figure 13:
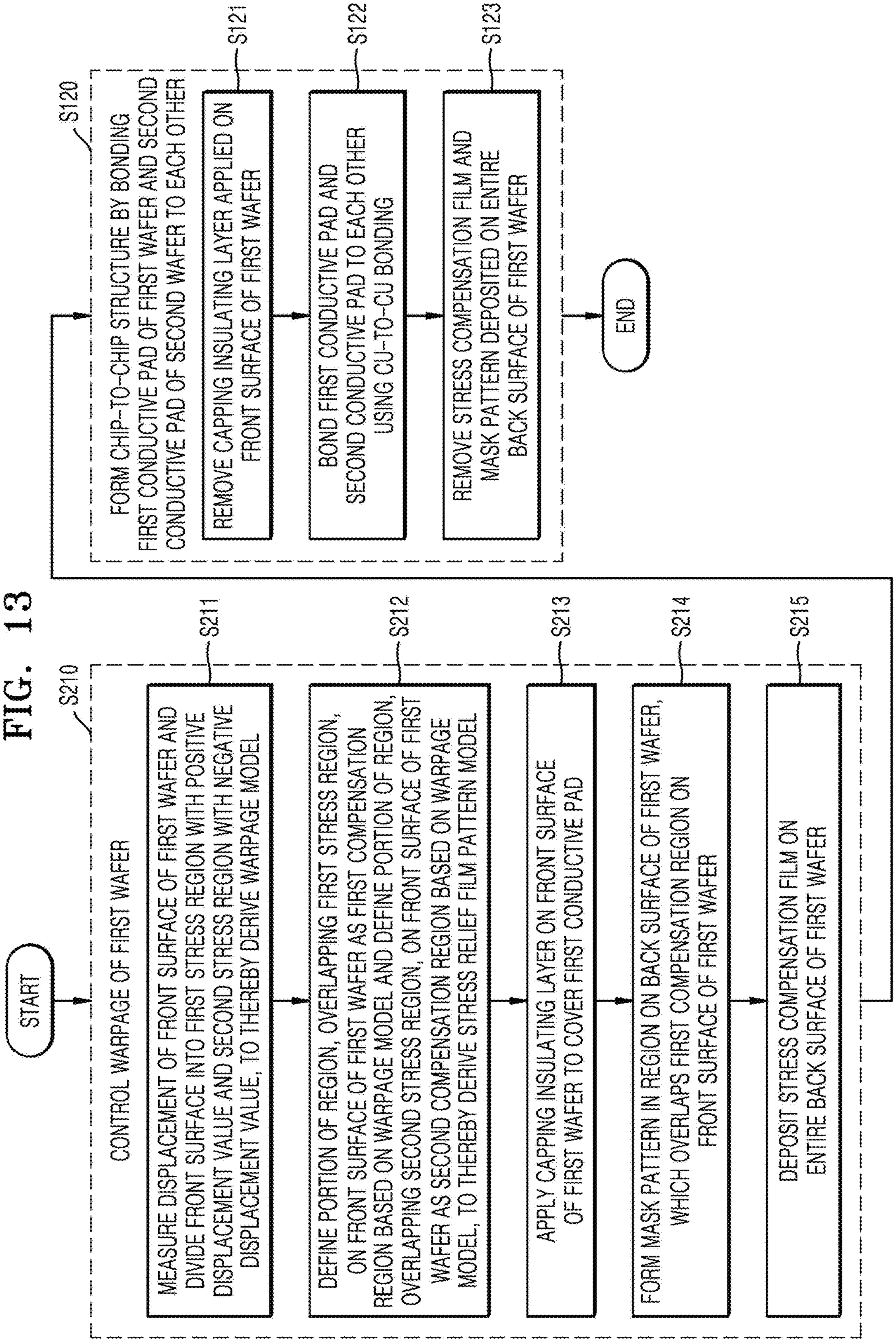
FIG. 13 is a flowchart of a semiconductor chip manufacturing method according to some implementations.
Figure 14:
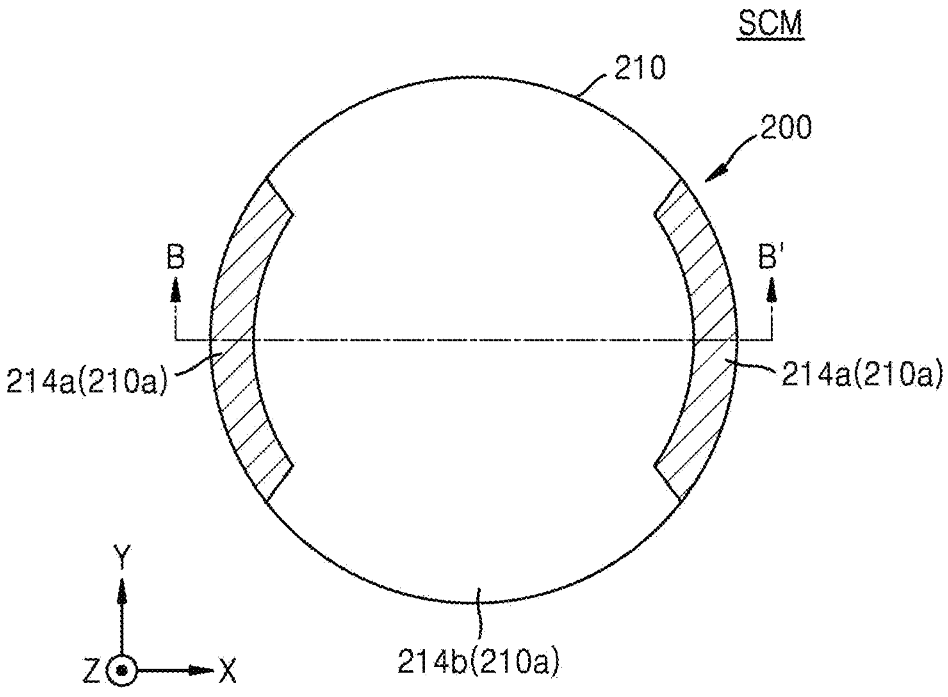
FIGS. 14-16 are diagrams sequentially showing a semiconductor chip manufacturing method.
Figure 15:
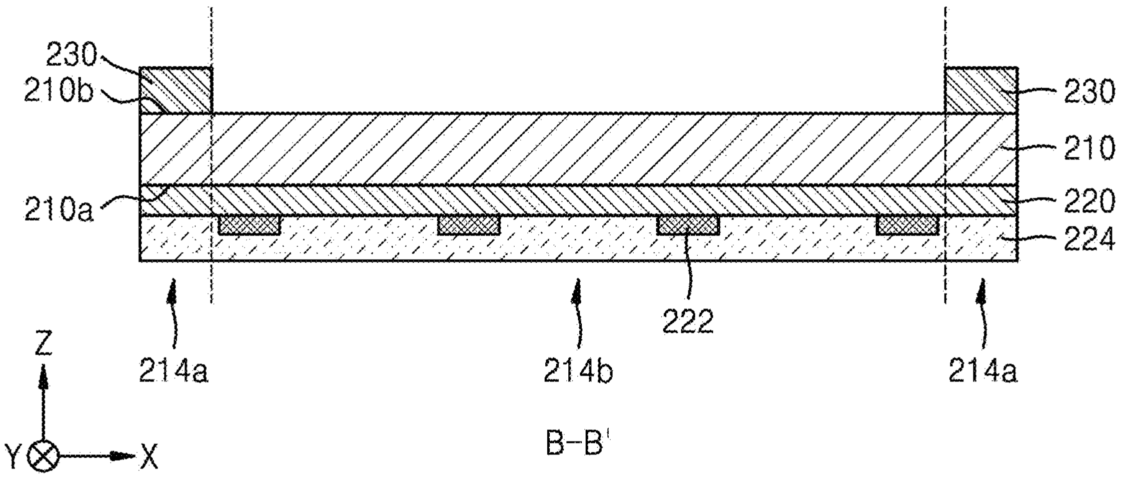
Figure 16:
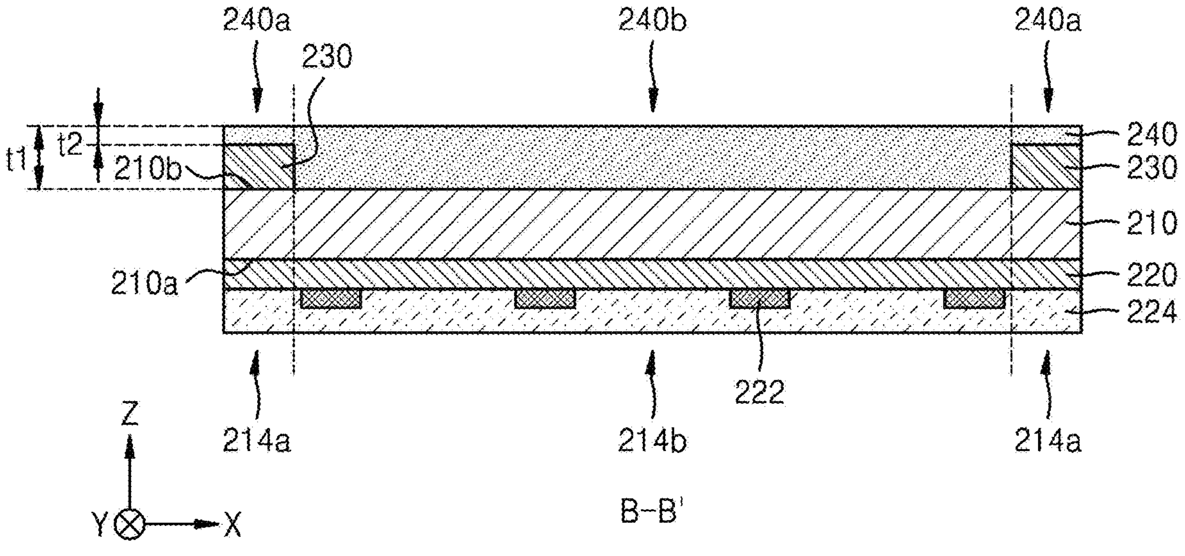

FIG. 13 is a flowchart of a semiconductor chip manufacturing method according to some implementations. FIGS. 14 to 16 are diagrams sequentially showing a semiconductor chip manufacturing method according to some implementations (e.g., the method of FIG. 13), and particularly, FIG. 14 is a plan view corresponding to FIG. 3, and FIGS. 15 and 16 are cross-sectional views corresponding to FIGS. 6 and 8, respectively. FIGS. 15 and 16 are cross-sectional views taken along line B-B' of FIG. 14.

The flowchart of the semiconductor chip manufacturing method shown in FIG. 13 is the same as the flowchart of the semiconductor chip manufacturing method shown in FIG. 1, with the only difference in an operation (S210) of controlling the warpage of a first wafer. Therefore, repeated descriptions of operations as those given with reference to FIG. 1 are omitted.

Referring to FIGS. 14 and 15 together with FIG. 13, the operation (S210) of controlling warpage of a first wafer 210 may include an operation (S214) of forming a mask pattern 230 in a region on a first back surface 210*b* of the first wafer 210, which overlaps a first compensation region 214*a* on a first front surface 210*a* of the first wafer 210. Unlike the semiconductor chip manufacturing method shown in FIGS. 1 and 4, the mask pattern 230 may be formed in a region overlapping the first compensation region 214*a* rather than a second compensation region 214*b* on the first front surface 210*a* of the first wafer 210. The first compensation region 214*a* includes a region corresponding to the first stress region 112*a* (see FIGS. 2 and 3), and the first stress region 112*a* (see FIGS. 2 and 3) includes a region having a negative first displacement value −z1 on the first front surface 110*a* of the first wafer 110.

Subsequently, referring to FIG. 16 together with FIG. 13, the semiconductor chip manufacturing method according to some implementations may include an operation (S215) of depositing a stress compensation film 240 over an entirety of the first back surface 210*b* of the first wafer 210.

The stress compensation film 240 deposited on the first back surface 210*b* of the first wafer 210 may cover the upper surface and side surfaces of the mask pattern 230. The stress compensation film 240 may cover the mask pattern 230 and a portion of the first back surface 210*b* of the first wafer 210. Here, a region of the first back surface 210*b* of the first wafer 210, which is covered by the stress compensation film 240, may overlap the second compensation region 214*b*. The second compensation region 214*b* includes a region corresponding to the second stress region 112*b* (see FIG. 2), and the second stress region 112*b* (see FIG. 2) includes a region having a positive displacement value on the first front surface 110*a* of the first wafer 110.

The stress compensation film 240 may include a first stress compensation film region 240*a* overlapping the first compensation region 214*a* of the first front surface 210*a* of the first wafer 210 in the vertical direction (Z direction) and a second stress compensation film region 240*b* overlapping the second compensation region 214*b* of the first front surface 210*a* of the first wafer 210 in the vertical direction (Z direction). Here, a thickness t2 of the first stress compensation film region 240*a* may be less than a thickness t1 of the second stress compensation film region 240*b*. The first stress compensation film region 240*a* may cover the upper surface of the mask pattern 230 and the second stress compensation film region 240*b* may cover the first back surface 210*b* of the first wafer 210. Therefore, a portion of the stress compensation film 240 that overlaps the first compensation region 214*a* in the vertical direction (Z direction) has specific gravity that is different from that of a portion of the stress compensation film 240 that overlaps the second compensation region 214*b* in the vertical direction (Z direction). This difference in thickness or specific gravity may ultimately result in a difference in stress applied to the first wafer 210.

When the stress compensation film 240 is deposited on the first back surface 210*b* of the first wafer 210, the first wafer 210 may be bent toward the first front surface 210*a* of the first wafer 210. For example, in a portion of the first wafer 210 covered by the stress compensation film 240, the displacement value in the vertical direction (Z direction) may increase so as to be opposite to the negative displacement value −z1 shown in FIG. 3. For example, the portion of the first wafer 210 covered by the stress compensation film 240 may have a positive displacement value in the vertical direction (Z direction).

The stress compensation film 240 is deposited on the first back surface 210*b* of the first wafer 210 having warpage, and thus, the displacement value in the vertical direction (Z direction) of the first wafer 210 due to the warpage may be compensated.

Figure 17:
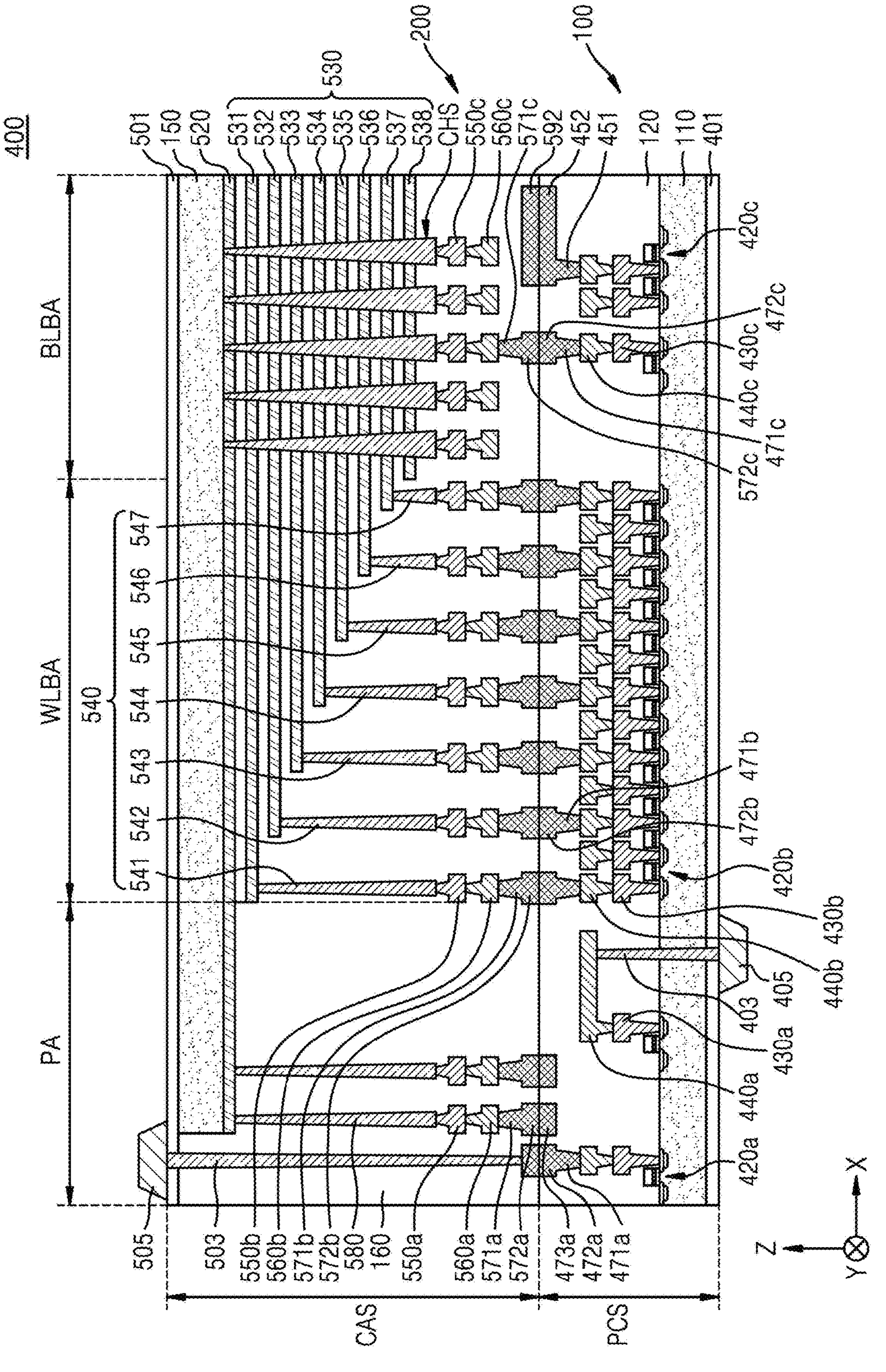
FIG. 17 is a cross-sectional view illustrating a semiconductor chip including a NAND flash device, according to some implementations.

FIG. 17 is a cross-sectional view illustrating a semiconductor chip 400 including a NAND flash device, according to some implementations.

Specifically, the semiconductor chip 400 may have a chip-to-chip structure. In the chip-to-chip structure, a first chip 100 including a peripheral circuit structure PCS including peripheral circuits on a first wafer 110 is manufactured, and a second chip 200 including a cell array structure CAS on a second wafer 150 that is different from the first wafer 110 is manufactured. Subsequently, the first chip 100 and the second chip 200 may be connected to each other by a bonding process. The first chip 100 and/or the second chip 200 may be processed using a warpage compensation method as described in reference to FIGS. 1-16.

For example, the bonding process may refer to a method of electrically connecting a bonding metal formed on the uppermost metal layer of the first chip 100 and a bonding metal formed on the uppermost metal layer of the second chip 200 to each other. For example, when the bonding metal includes copper (Cu), the bonding process may include a Cu—Cu bonding process. Also, the bonding metal may include aluminum (Al) or tungsten (W).

Each of the peripheral circuit structure PCS and the cell array structure CAS of the semiconductor chip 400 may include an external pad bonding region PA, a word line bonding region WLBA, and a bit line bonding region BLBA.

The peripheral circuit structure PCS may include the first wafer 110, a first insulating layer 120, a plurality of circuit elements 420*a*, 420*b*, and 420*c* formed on the first wafer 110, first metal layers 430*a*, 430*b*, and 430*c* connected to the plurality of circuit elements 420*a*, 420*b*, and 420*c*, respectively, and second metal layers 440*a*, 440*b*, and 440*c* formed on the first metal layers 430*a*, 430*b*, and 430*c*.

The circuit elements 420*a*, 420*b*, and 420*c* may include transistors. In some implementations, the first metal layers 430*a*, 430*b*, and 430*c* may include tungsten with a relatively high resistivity and the second metal layers 440*a*, 440*b*, and 440*c* may include copper with a relatively low resistivity.

In this specification, only the first metal layers 430*a*, 430*b*, and 430*c* and the second metal layers 440*a*, 440*b*, and 440*c* are shown and described, but implementations are not limited thereto. One or more additional metal layers may be formed on the second metal layers 440*a*, 440*b*, and 440*c*. At least some of the one or more metal layers formed on the second metal layers 440*a*, 440*b*, and 440*c* may include aluminum or the like, which has a lower resistivity than copper that forms the second metal layers 440*a*, 440*b*, and 440*c*.

The first insulating layer 120 may be disposed on the first wafer 110 to cover the plurality of circuit elements 420*a*, 420*b*, and 420*c*, the first metal layers 430*a*, 430*b*, and 430*c*, and the second metal layers 440*a*, 440*b*, and 440*c* and may include insulating materials, such as silicon oxide and silicon nitride.

Lower bonding metals 471*b* and 472*b* may be formed on the second metal layer 440*b* of the word line bonding region WLBA. In the word line bonding region WLBA, the lower bonding metals 471*b* and 472*b* of the peripheral circuit structure PCS may be electrically connected to upper bonding metals 571*b* and 572*b* of the cell array structure CAS by a bonding process, and the lower bonding metals 471*b* and 472*b* and the upper bonding metals 571*b* and 572*b* may include aluminum, copper, or tungsten.

The cell array structure CAS may provide at least one memory cell block. The cell array structure CAS may include the second wafer 150 and a common source line 520. A plurality of word lines 530 (531 to 538) may be stacked on the second wafer 150 in a direction (Z direction) perpendicular to the upper surface of the second wafer 150. String selection lines and a ground selection line may be arranged above and below of the word lines 530, and the plurality of word lines 530 may be arranged between the string selection lines and the ground selection line.

In the bit line bonding region BLBA, a channel structure CHS may extend in a direction (Z direction) perpendicular to the upper surface of the second wafer 150 and pass through the word lines 530, the string selection lines, and the ground selection line. The channel structure CHS may include a data storage layer, a channel layer, and a buried insulating layer, and the channel layer may be electrically connected to a first metal layer 550*c* and a second metal layer 560*c*. For example, the first metal layer 550*c* may include a bit line contact and the second metal layer 560*c* may include a bit line (hereinafter, the second metal layer 560*c* may also be referred to as a bit line 560*c*). In some implementations, the bit line may extend in a second horizontal direction (Y direction) parallel to the front surface of the second wafer 150.

In some implementations, a region, in which the channel structure CHS and the bit line 560*c* are arranged, may be defined as a bit line bonding region BLBA. The bit line 560*c* may be electrically connected to the circuit elements 420*c* in the peripheral circuit structure PCS of the bit line bonding region BLBA. For example, the bit line 560*c* may be connected to upper bonding metals 571*c* and 572*c* in the peripheral circuit structure PCS and the upper bonding metals 571*c* and 572*c* may be connected to lower bonding metals 471*c* and 472*c* connected to the circuit elements 420*c*.

In the word line bonding region WLBA, the word lines 530 may extend in a first direction (X direction) parallel to the upper surface of the second wafer 150 and may be connected to a plurality of cell contact plugs 540 (541 to 547). The word lines 530 and the cell contact plugs 540 may be connected to each other at pads provided by at least some of the word lines 530 extending to different lengths in the first direction (X direction). A first metal layer 550*b* and a second metal layer 560*b* may be sequentially connected to the upper portion of each of the cell contact plugs 540 connected to the word lines 530. The cell contact plugs 540 may be connected to the peripheral circuit structure PCS via the upper bonding metals 571*b* and 572*b* of the cell array structure CAS and the lower bonding metals 471*b* and 472*b* of the peripheral circuit structure PCS in the word line bonding region WLBA. The cell contact plugs 540 may be electrically connected to the circuit elements 420*b* of the peripheral circuit structure PCS.

A common source line contact plug 580 may be provided in the external pad bonding region PA. The common source line contact plug 580 may include a conductive material, such as metal, metal compound, or polysilicon, and may be electrically connected to the common source line 520. A first metal layer 550*a* and a second metal layer 560*a* may be sequentially stacked on the common source line contact plug 580. For example, a region, in which the common source line contact plug 580, the first metal layer 550*a*, and the second metal layer 560*a* are arranged, may be defined as the external pad bonding region PA.

Lower bonding metals 471*a* and 472*a* may be formed in the external pad bonding region PA. In the external pad bonding region PA, the lower bonding metals 471*a* and 472*a* of the peripheral circuit structure PCS may be electrically connected to upper bonding metals 571*a* and 572*a* of the cell array structure CAS by a bonding process, and the lower bonding metals 471*a* and 472*a* and the upper bonding metals 571*a* and 572*a* may include aluminum, copper, or tungsten.

Also, first and second input/output pads 405 and 505 may be arranged in the external pad bonding region PA. A lower insulating film 401 may be formed below the first wafer 110 to cover the lower surface of the first wafer 110, and the first input/output pad 405 may be formed on the lower insulating film 401. The first input/output pad 405 may be connected to at least one of the plurality of circuit elements 420*a*, 420*b*, and 420*c* arranged in the peripheral circuit structure PCS via a first input/output contact plug 403 and may be separated from the first wafer 110 by the lower insulating film 401. Also, a side insulating film may be provided between the first input/output contact plug 403 and the first wafer 110 and electrically separate the first input/output contact plug 403 from the first wafer 110.

An upper insulating film 501 may be formed above the second wafer 150 to cover the upper surface of the second wafer 150, and the second input/output pad 505 may be provided on the upper insulating film 501. The second input/output pad 505 may be connected to at least one of the plurality of circuit elements 420*a*, 420*b*, and 420*c* arranged in the peripheral circuit structure PCS via a second input/output contact plug 503.

In some implementations, the second wafer 150 and the common source line 520 may not be provided in a region in which the second input/output contact plug 503 is located. Also, the second input/output pad 505 may not overlap the word lines 530 in a third direction (Z-axis direction). The second input/output contact plug 503 may be separated from the second wafer 150 in a direction parallel to the upper surface of the second wafer 150 and may be connected to the second input/output pad 505 after passing through the second insulating layer 160 of the cell array structure CAS.

In some implementations, the first input/output pad 405 and the second input/output pad 505 may be formed selectively. For example, the semiconductor chip 400 may include only the first input/output pad 405 disposed on the first wafer 110 or may include only the second input/output pad 505 disposed on the second wafer 150. Alternatively, the semiconductor chip 400 may include both the first input/output pad 405 and the second input/output pad 505.

In each of the external pad bonding region PA and the bit line bonding region BLBA included in each of the cell array structure CAS and peripheral circuit structure PCS, a metal pattern of the uppermost metal layer may exist as a dummy pattern, or the uppermost metal layer may be empty.

In the external pad bonding region PA of the semiconductor chip 400, in order to correspond to an upper metal pattern 572*a* formed on the uppermost metal layer of the cell array structure CAS, lower metal patterns 472*a* and 473*a* having the same shape as the upper metal pattern 572*a* of the cell array structure CAS may be formed on the uppermost metal layer of the peripheral circuit structure PCS. The lower metal pattern 473*a* formed on the uppermost metal layer of the peripheral circuit structure PCS may not be connected to a separate contact in the peripheral circuit structure PCS. Similarly, in the external pad bonding region PA, in order to correspond to the lower metal pattern 473*a* formed on the uppermost metal layer of the peripheral circuit structure PCS, the upper metal pattern 572*a* having the same shape as the lower metal pattern 473*a* of the peripheral circuit structure PCS may be formed on the upper metal layer of the cell array structure CAS.

The lower bonding metals 471*b* and 472*b* may be formed on the second metal layer 440*b* of the word line bonding region WLBA. In the word line bonding region WLBA, the lower bonding metals 471*b* and 472*b* of the peripheral circuit structure PCS may be electrically connected to the upper bonding metals 571*b* and 572*b* of the cell array structure CAS by a bonding process.

Also, in the bit line bonding region BLBA, in order to correspond to a lower metal pattern 452 formed on the uppermost metal layer of the peripheral circuit structure PCS, an upper metal pattern 592 having the same shape as the lower metal pattern 452 of the peripheral circuit structure PCS may be formed on the uppermost metal layer of the cell array structure CAS. A contact may not be formed on the upper metal pattern 592 formed on the uppermost metal layer of the cell array structure CAS. The lower metal pattern 452 of the peripheral circuit structure PCS may be electrically connected to a circuit element 420*c* via a metal layer 451.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

While implementations have been particularly shown and described with reference to certain examples thereof, it will be understood that various changes in form and details may be made therein without departing from the spirit and scope of the following claims.

What is claimed is:

1. A warpage control method comprising:

measuring wafer displacement in a vertical direction perpendicular to a front surface of a wafer to identify that a first stress region of the front surface of the wafer has a negative displacement value, and that a second stress region of the front surface of the wafer has a positive displacement value;

forming a mask pattern in a mask region on a back surface of the wafer, wherein the mask region overlaps a second compensation region on the front surface of the wafer in the vertical direction, wherein a first compensation region on the front surface of the wafer overlaps the first stress region in the vertical direction, and wherein the second compensation region comprises the front surface of the wafer other than the first compensation region; and depositing a stress compensation film over the mask region on the back surface and over at least a portion of the back surface other than the mask region.

2. The warpage control method of claim 1, wherein the mask region does not overlap the first stress region in the vertical direction.

3. The warpage control method of claim 1, wherein the stress compensation film comprises:

a first stress compensation film region overlapping the first compensation region on the front surface of the wafer in the vertical direction; and a second stress compensation film region overlapping the second compensation region on the front surface of the wafer in the vertical direction, wherein a thickness of the first stress compensation film region is greater than a thickness of the second stress compensation film region.

4. The warpage control method of claim 1, comprising depositing the stress compensation film using at least one of a chemical vapor deposition process, a physical vapor deposition process, or an atomic layer deposition process.

5. The warpage control method of claim 1, wherein the mask pattern is in contact with the back surface of the wafer and has a constant thickness along the back surface of the wafer.

6. The warpage control method of claim 1, wherein an area of the mask pattern in contact with the back surface of the wafer is greater than an area of the stress compensation film in contact with the back surface of the wafer.

7. The warpage control method of claim 1, wherein the mask region overlaps an entirety of the second compensation region and does not overlap the first compensation region in the vertical direction, and wherein an area of the first compensation region is less than an area of the second compensation region.

8. The warpage control method of claim 1, wherein the mask region overlaps an entirety of the second compensation region and does not overlap the first compensation region in the vertical direction, wherein an area of the first compensation region is less than or equal to an area of the first stress region, and wherein an area of the second compensation region is greater than or equal to an area of the second stress region.

9. The warpage control method of claim 1, wherein forming the mask pattern comprises using an inkjet printing technique.

10. A semiconductor chip manufacturing method comprising:

measuring wafer displacement in a vertical direction perpendicular to a front surface of a first wafer to identify that a first stress region of the front surface of the first wafer has a negative displacement value, and that a second stress region of the front surface of the first wafer has a positive displacement value;

applying a capping insulating layer on the front surface of the first wafer to cover a first conductive pad on the front surface of the first wafer;

forming a mask pattern in a mask region on a back surface of the first wafer, wherein the mask region overlaps a second compensation region on the front surface of the first wafer in the vertical direction, wherein a first compensation region on the front surface of the first wafer overlaps the first stress region in the vertical direction, and wherein the second compensation region comprises the front surface of the first wafer other than the first compensation region;

depositing a stress compensation film over the mask region on the back surface and over at least a portion of the back surface other than the mask region; and forming a chip-to-chip structure by bonding the first conductive pad to a second conductive pad on a front surface of a second wafer.

11. The semiconductor chip manufacturing method of claim 10, wherein the first wafer comprises a cell region that is on the front surface of the first wafer and comprises a plurality of word lines stacked in the vertical direction, and wherein the plurality of word lines are electrically connected to the first conductive pad.

12. The semiconductor chip manufacturing method of claim 10, wherein the second wafer comprises a peripheral region that is on the front surface of the second wafer and comprises a plurality of circuit elements, and wherein the plurality of circuit elements are electrically connected to the second conductive pad.

13. The semiconductor chip manufacturing method of claim 10, wherein the mask region does not overlap the first stress region in the vertical direction.

14. The semiconductor chip manufacturing method of claim 10, wherein forming the chip-to-chip structure comprises:

removing the capping insulating layer;

bonding the first conductive pad and the second conductive pad to each other using copper to copper (Cu-to-Cu) bonding; and removing the stress compensation film and the mask pattern.

15. The semiconductor chip manufacturing method of claim 14, wherein, during the bonding of the first conductive pad and the second conductive pad to each other using the Cu-to-Cu bonding, an upper surface of the first conductive pad and an upper surface of the second conductive pad are coplanar with each other.

16. The semiconductor chip manufacturing method of claim 10, comprising forming the mask pattern using an inkjet printing technique.

17. The semiconductor chip manufacturing method of claim 10, wherein the stress compensation film comprises:

a first stress compensation film region overlapping the first compensation region in the vertical direction; and a second stress compensation film region overlapping the second compensation region in the vertical direction, wherein the first stress compensation film region covers a side surface of the mask pattern, and wherein the second stress compensation film region covers an upper surface of the mask pattern.

18. The semiconductor chip manufacturing method of claim 17, depositing the stress compensation film comprises:

plasma-treating the upper surface of the mask pattern, and depositing the stress compensation film using a selective atomic layer deposition process, wherein a thickness of the first stress compensation film region is greater than a thickness of the second stress compensation film region.

19. The semiconductor chip manufacturing method of claim 10, wherein the mask pattern comprises photosensitive polyimide.

20. A semiconductor chip manufacturing method comprising:

measuring wafer displacement in a vertical direction perpendicular to a front surface of a first wafer, to identify that a first stress region of the front surface of the first wafer has a negative displacement value, and that a second stress region of the front surface of the first wafer has a positive displacement value;

applying a capping insulating layer on the front surface of the first wafer;

forming a mask pattern in a mask region on a back surface of the first wafer, wherein the mask region overlaps a second compensation region on the front surface of the first wafer in the vertical direction, wherein a first compensation region on the front surface of the first wafer overlaps the first stress region in the vertical direction, and wherein the second compensation region comprises the front surface of the first wafer other than the first compensation region;

depositing a stress compensation film over the mask region on the back surface and over at least a portion of the back surface other than the mask region;

removing the capping insulating layer on the front surface of the first wafer; and bonding a first chip and a second chip to one another, wherein the first chip comprises the first wafer, a cell region provided on the front surface of the first wafer and comprising a plurality of word lines stacked in the vertical direction, and a first conductive pad on the cell region, wherein the second chip comprises a second wafer and a peripheral region provided on a front surface of the second wafer and comprising a plurality of circuit elements, and wherein bonding the first chip and the second chip to one another comprises bonding the first conductive pad to a second conductive pad on a front surface of the second wafer using copper to copper bonding; and removing the stress compensation film and the mask pattern, wherein the mask region does not overlap the first stress region in the vertical direction.

* * * * *